United States Patent [19]

Nieh et al.

[11] Patent Number: 5,487,922
[45] Date of Patent: Jan. 30, 1996

[54] SURFACE PREPARATION AND DEPOSITION METHOD FOR TITANIUM NITRIDE ONTO CARBON-CONTAINING MATERIALS

[75] Inventors: Simon K. Nieh, Monrovia; Jesse N. Matossian, Canoga Park; Frans G. Krajenbrink, Newbury Park; Robert W. Schumacher, Woodland Hills, all of Calif.

[73] Assignee: Hughes Aircraft Company, Los Angeles, Calif.

[21] Appl. No.: 259,371

[22] Filed: Jun. 14, 1994

Related U.S. Application Data

[63] Continuation of Ser. No. 929,970, Aug. 14, 1992, abandoned.

[51] Int. Cl.[6] ............... B05D 3/06; C23C 14/00; C23F 1/00
[52] U.S. Cl. ............ 427/528; 427/530; 427/534; 427/535; 427/573; 204/192.16; 204/192.32; 204/192.35; 216/67
[58] Field of Search .................. 427/534, 536, 427/573, 569, 576, 524, 525, 528, 530, 535; 156/643, 633; 204/192.15, 192.16, 192.3, 192.32, 192.35

[56] References Cited

U.S. PATENT DOCUMENTS

| | | | |
|---|---|---|---|
| 4,420,498 | 12/1983 | Hirose et al. | 427/576 |
| 4,428,812 | 1/1984 | Sproul | 204/192 R |
| 4,436,761 | 3/1984 | Hayashi et al. . | |
| 4,461,689 | 7/1984 | Diepers | 427/534 |
| 4,500,564 | 2/1985 | Enomoto . | |
| 4,507,189 | 3/1985 | Doi | 204/192 N |
| 4,540,596 | 9/1985 | Nimmagadda | 427/534 |
| 4,762,756 | 8/1988 | Bergmann et al. | 428/698 |
| 4,842,710 | 6/1989 | Freller et al. | 427/576 |
| 4,873,115 | 10/1989 | Matsumura et al. | 427/573 |
| 4,990,363 | 2/1991 | Suhr et al. | 427/534 |
| 5,070,228 | 12/1991 | Siemers et al. | 427/534 |
| 5,135,775 | 8/1992 | Foller et al. . | |
| 5,192,582 | 3/1993 | Liedke et al. | 427/534 |
| 5,346,600 | 9/1994 | Nieh et al. | 427/530 |

FOREIGN PATENT DOCUMENTS

| | | | |
|---|---|---|---|
| 3233279 | 2/1986 | Germany . | |
| 233278 | 2/1986 | Germany | 427/534 |
| 1420374 | 10/1989 | Japan | 427/534 |
| 3249169 | 11/1991 | Japan | 427/534 |

OTHER PUBLICATIONS

Kominiak et al, "Reactive Plasma Cleaning of Metals", *Thin solid Films*, 40(1977) pp. 141–148—no month.

Perry, ed. *"Chemical Engineer's Handbook"*, 1963 (no month McGraw–Hill Book Co., Inc., N.Y. pp. 23–6 to 7, 12, 48 to 51.

J. Electrochem. Soc.: Solid–State Science and Technology, vol. 134, No. 3, Mar. 1987, T. J. Faith et al., "Comparative Investigation of CF4–Plasma, Ar–Plasma, and Dilute–HF–Dip Cleaning Methods for (Al–Si)/n+Si Contacts", pp. 665–668.

*Primary Examiner*—Marianne Padgett
*Attorney, Agent, or Firm*—Vijayalakshmi D. Duraiswamy; Wanda K. Denson-Low

[57] ABSTRACT

Wear-resistant titanium nitride coatings onto cast iron and other carbon-containing materials is enhanced by means of a new surface preparation and deposition process. The conventional pre-deposition surface cleaning by $Ar^+$ ion bombardment is replaced by a hydrogen-ion bombardment process which cleans the substrate surface by chemical reaction with minimal sputtering and simultaneously removes graphite present on the cast iron surface. Removal of the graphite significantly improves the wear resistance of titanium nitride, since the presence of graphite causes initiation of wear at those sites. Hydrogen ion bombardment or electron bombardment may be used to heat the substrate to a chosen temperature. Finally, titanium nitride is deposited by reactive sputtering with simultaneous bombardment of high-flux $Ar^+$ ions from an independently generated dense plasma. The resulting titanium nitride coating on cast iron evidences superior wear properties and adhesion compared to conventional reactive evaporation deposition techniques for titanium nitride.

24 Claims, 6 Drawing Sheets

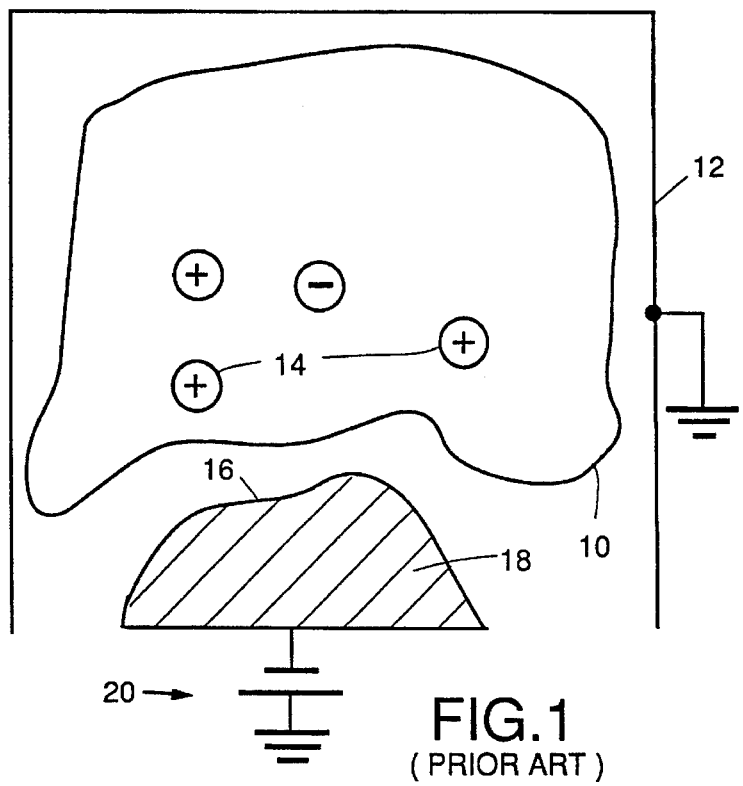
FIG.1
(PRIOR ART)
FIG. 7.
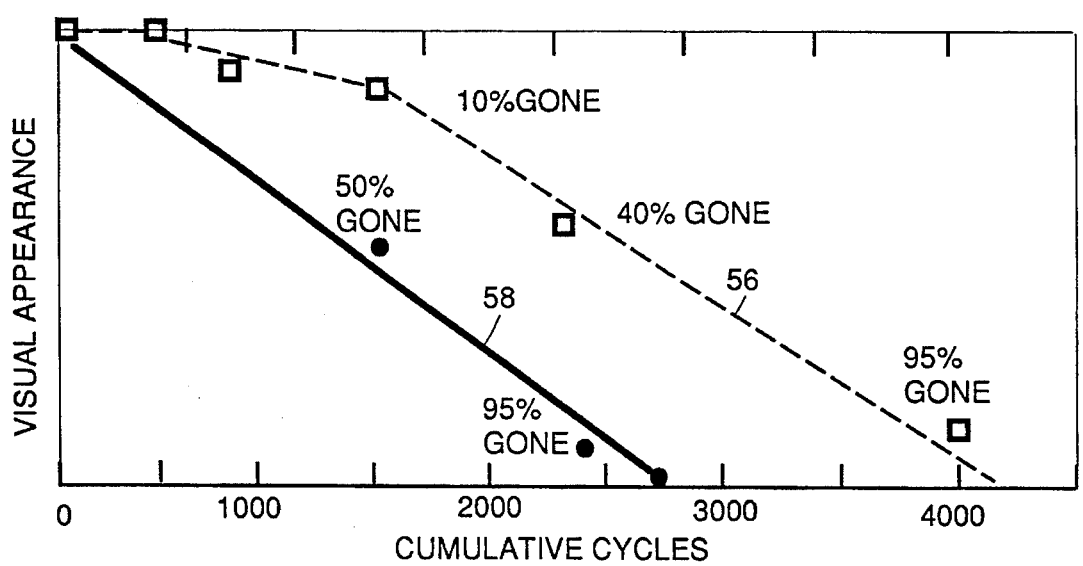

SURFACE PREPARATION AND DEPOSITION METHOD FOR TITANIUM NITRIDE ONTO CARBON-CONTAINING MATERIALS

CROSS-REFERENCE TO RELATED APPLICATION

This is a continuation of application Ser. No. 07/929,970, filed Aug. 14, 1992.

The present application is related to application Ser. No. 07/929,986, filed on even date herewith, and entitled "Plasma-Enhanced Magnetron-Sputtered Deposition of Materials", now U.S. Pat. No. 5,346,600, issued Sep. 13, 1994.

BACKGROUND OF THE INVENTION

1. Field of the Invention

The present application relates to the deposition of a layer of material onto carbonaceous substrates, and, more particularly, to the deposition of titanium nitride onto cast iron.

2. Description of Related Art

Titanium nitride coatings on substrates are used to provide improved wear properties to the substrate materials. For example, cast iron foundry tools are exposed to sand abrasion, and it is desired to resist the wear resulting from such sand abrasion. Titanium nitride overcoatings could provide such wear resistance.

The deposition of titanium nitride onto substrates is disclosed in, for example, U.S. Pat. No. 4,197,175, using a reactive evaporation (RE) process. The deposition method comprises evaporating titanium in a vacuum evaporator. The evaporated titanium atoms deposit onto a substrate that is simultaneously bombarded with argon ions to grow a hard coating of titanium nitride using nitrogen gas that is introduced into the process chamber.

Prior to depositing titanium nitride onto the substrate surface, the substrate is bombarded using an argon-ion plasma. The Ar-ion bombardment accomplishes the task of sputter-cleaning the substrate surface. This physical sputtering cleans the substrate surface of foreign atoms and atom-species such as oxides that may be present, as well as surface hydrocarbons. The sputtering also removes a small amount of the substrate material itself, but this can be controlled to be minimal.

Chemically-reactive gases or chemically-reactive plasmas are not used to clean the surface of oxides and other surface contaminants. Instead, surface cleaning is accomplished by physical sputtering. This is disadvantageous for substrate materials which are sputter-sensitive, such as with carbonaceous materials like cast iron.

Once the surface is sputter-cleaned, heating of the substrate is accomplished by bombarding the substrate with electrons. Titanium nitride is then grown at the desired temperature with simultaneous argon ion bombardment of the film.

With the RE process, it has been observed that the deposition of titanium nitride on the surfaces of high carbon-containing materials, such as cast iron, does not provide good wear properties. The principal reason for this is the graphite that is in cast iron.

Most types of cast iron, such as the commonly-used gray cast iron, contain free graphite, which is added to aid in machinability and improved wear properties due to its lubricating ability. Without subscribing to any particular theory, it appears that the physical sputtercleaning step used in the above-described RE process results in the preferential sputtering of cast iron relative to the free graphite, due to the much lower sputter yield of graphite compared to that of iron. The result of this is that graphite is left on the surface of the cast iron prior to the deposition of the titanium nitride coating. Since graphite itself is brittle, the titanium nitride coating that is deposited onto the cast iron surface has poor adhesion and poor wear properties.

The use of neutral hydrogen is known to remove carbon from the surface of carbon-containing steels at temperatures higher than 700° C. through the following reaction:

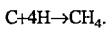

$$C + 4H \rightarrow CH_4.$$

However, this technique is ill-suited for preparing a surface prior to the deposition of titanium nitride. At a temperature of 700° C., carbon atoms in the cast iron are mobile. Once the carbon atoms on the cast iron surface are removed by hydrogen, the carbon atoms underneath the surface can diffuse to the surface, driven by the carbon concentration gradient, and then be removed from the surface by the neutral hydrogen gas. This high temperature process generates a decarburized and soft surface layer. This is described in the *Metals Handbook*, 9th Edition, Vol. 1, "Properties and Selection", American Society for Metals, 1978, pp. 66,301, 673–674, and 705. This soft substrate is ill-suited for supporting a hard coating of titanium nitride and would result in poor wear properties of the coating. Furthermore, this cleaning procedure is not applicable for temperature-sensitive substrates, since high temperature (>700° C.) is required.

The use of hydrogen plasma is well-known to remove surface contaminants, such as oxides and hydrocarbons, from substrates at room temperature. This is described by M. J. Vasile et al, "Mass Spectroscopy of Plasmas", in *Plasma Diagnostics*, Vol. I, Discharge Parameters and Chemistry, Edited by O. Auciello and D. Flamm, Academic Press, 1989.

However, these techniques do not teach the proper preparation of the surface for the subsequent deposition of hard films of titanium nitride that adhere to the surface nor substrate heating to the desired temperature for the film deposition.

Thus, a process is needed that provides improved adhesion and wear properties of titanium nitride deposited onto the surfaces of materials containing carbon in the form of graphite, such as found in certain commonly-used cast irons.

SUMMARY OF THE INVENTION

In accordance with the invention, a process is provided for improving the adhesion of titanium nitride onto cast iron and other graphite-containing materials to improve their wear properties. The new surface preparation and deposition process for titanium nitride makes use of separate and distinct hydrogen-ion and electron bombardment processes that are different from that used in conventional deposition techniques. Prior to the deposition of titanium nitride, a hydrogen plasma is created that surrounds the substrate. The substrate is biased negative with respect to the plasma to bombard the surface with positive hydrogen ions, instead of argon ions as in the prior art RE process. This hydrogen-ion bombardment process is used to clean the surface of oxides and other contaminants by chemical reaction, instead of sputtering, and to simultaneously remove graphite present on the cast iron surface prior to the deposition of titanium nitride. The same hydrogen plasma can be used to simultaneously heat the substrate to the desired temperature prior to deposition, using the hydrogen-ion bombardment. Alternatively, by biasing the substrate positive with respect to the hydrogen plasma, electrons can be used to heat the substrate to the desired temperature.

This surface preparation process is considered to be novel for depositing titanium nitride onto cast iron and other metals containing a significant amount of carbon, that is, greater than about 1 wt. %, with the carbon present in the form of graphite in addition to its combined form. Removal of the graphite from cast iron aids in the adhesion and wear properties of the titanium nitride coating. Compared to the prior art RE process, the resulting titanium nitride coating on cast iron treated in the manner described demonstrates improved tribological (friction and wear) properties.

Though specifically developed for application to cast iron containing graphite, the surface preparation process can be used prior to the deposition of titanium nitride onto other graphite-containing materials, such as high-carbon-content steels, or onto materials which are sensitive to sputter-cleaning.

It should be noted that the surface preparation process for depositing a hard titanium nitride coating onto carbonaceous metals (>1% C) is what is considered to be new and useful. The heart of this is the novel use of hydrogen plasma to clean the substrate surface and simultaneously remove graphite from the substrate surface.

The present invention is distinct and different from the prior art decarburizing process that employs neutral hydrogen gas in that a hydrogen plasma is used to remove carbon. In decarburizing, carbon is removed to a depth of a few mils beneath the surface, which softens the cast iron surface. In contrast to this, the present invention removes only the carbon directly exposed to the hydrogen plasma; no carbon out-diffusion is involved. The process of the invention does not soften the surface, as in decarburizing; however, it does provide enough graphite removal to improve the adhesion and wear properties of a coating of titanium nitride. Furthermore, because a hydrogen plasma is used, carbon removal can be conducted at room temperature. There is no requirement to use a high substrate temperature of 700° C. which can cause hydrogen absorption into the metal and subsequent embrittlement.

BRIEF DESCRIPTION OF THE DRAWINGS

FIG. 1 is a schematic diagram of the reactive evaporation (RE) process of the prior art;

FIG. 7, on coordinates of amount of coating removed and cumulative cycles, is a plot of the amount of wear (removal of titanium nitride coating) as a function of the number of abrasion cycles for cast iron samples treated in accordance with the invention compared with cast iron samples treated by the prior art RE process.

DESCRIPTION OF THE PREFERRED EMBODIMENTS

Figure 2:
FIG. 2 is a scanning electron microscope photograph (1000X) showing the surface features of a cast iron sample coated with titanium nitride by the prior art RE process.

FIG. 1 depicts the generic process of the prior art, using an argon-ion plasma 10 maintained in a grounded chamber 12 to create argon ions 14 for (1) sputter-cleaning the surface 16 of a substrate 18, (2) maintaining the substrate surface temperature during deposition, and (3) influencing the microstructure of the deposited film (not shown).

A cast iron block 18' was coated by the above-described process. Wear tests indicated that the prior art process was not as effective in reducing wear compared to the process of the invention.

FIG. 2 is a photograph of a magnified region of the prior art coating on the cast iron block. The presence of free graphite protrusions caused by argon bombardment of cast iron is clearly shown. The presence of such graphite protrusions prevents good adhesion of the titanium nitride coating to the surface of the cast iron. These protrusions break off easily during the early stage of the wear test and initiate the failure of the protective coating.

A surface preparation and deposition process is provided in accordance with the invention that is distinct and different from the prior art process described above that results in improved tribological properties for cast iron samples coated with titanium nitride. The process is shown schematically in FIGS. 3A–C. The sputter targets are not shown in FIGS. 3A–C, but are depicted in FIG. 4, which shows the relationship of the substrate 18, plasma, and sputtering targets. The apparatus is described in greater detail in copending application Ser. No. 07/929,986, filed concurrently herewith now U.S. Pat. No. 5,346,600.

Figure 3A:
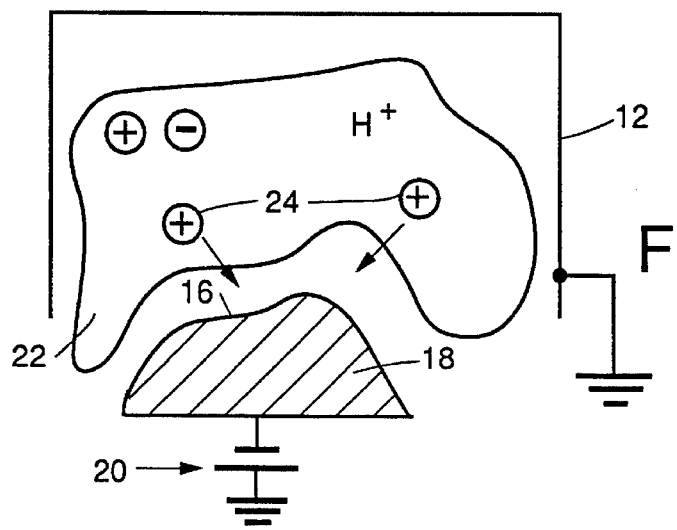
FIGS. 3A, 3B and 3C depict the process of the invention, comprising removal of graphite (FIG. 3A), substrate heating (FIG. 3B), and titanium nitride deposition (FIG. 3C)
Figure 4:
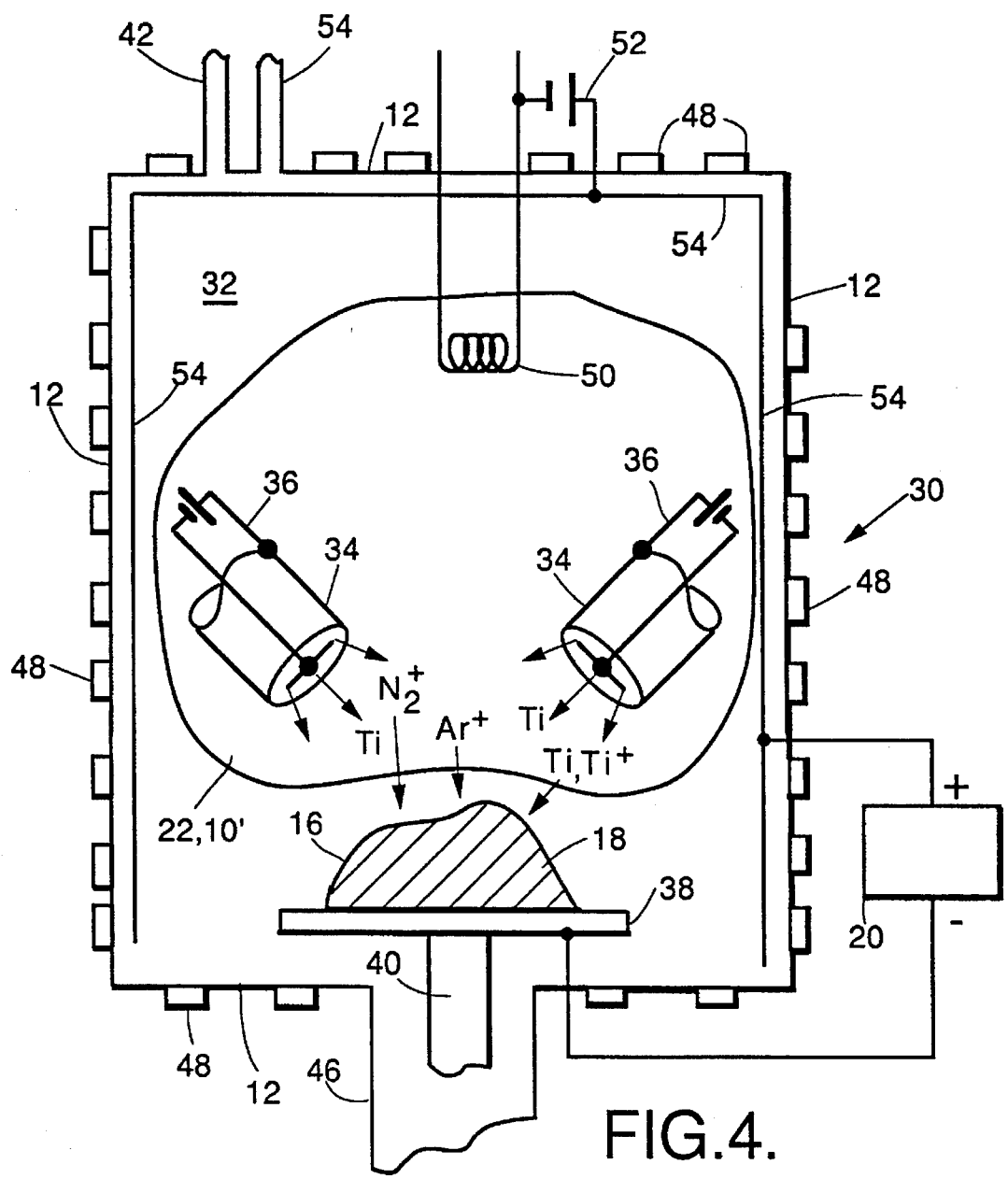
FIG. 4 is a schematic diagram representative of the apparatus used in the practice of the invention.

As shown in FIG. 3A, a hydrogen-ion plasma 22 is produced that surrounds the substrate 18. The substrate 18 is then biased negative with respect to the plasma 22 to bombard the substrate surface 16 with hydrogen ions 24. The energy of the hydrogen ions 24 ranges from about 50 to 200 volts. An energy of less than about 50 volts does not provide enough hydrogen ions to the surface to clean it, while an energy of greater than about 200 volts results in undesired sputtering of the surface.

The hydrogen-ion plasma density is about $10^{10}$ to $10^{12}$ hydrogen ions/cm$^3$. The time of cleaning is dependent on the plasma density; the higher the density, the less time required. At a plasma density of $10^{10}$ hydrogen ions/cm$^3$ the treatment time required is about 1 hour.

The hydrogen ions 24 are used to clean off oxides and hydrocarbon contaminants on the surface 16 and also remove the "free" graphite in the cast iron matrix described above. Graphite flakes often extend into the substrate; the removal of graphite by the hydrogen plasma follows the graphite and goes below the surface. The depth of the graphite removal depends on the process conditions. As an example, at $10^{10}$ hydrogen ions/cm$^3$ 100V and 1 hour, about 1 to 2 μm of the graphite was removed.

The hydrogen ions react with graphite to produce methane and with oxide to produce water. While the most preferred embodiment of the invention employs a hydrogen ion plasma, other ions that may be used for cleaning purposes include fluorine and chlorine ions; these may generated, for example, by using $CF_4$ and $CCl_4$ plasmas, respectively.

The use of hydrogen plasma for cleaning with minimum sputtering is considered to be novel, and is useful for removing carbonaceous material (e.g., graphite) and oxides from the surfaces of substrates. This step is equally applicable to any deposition process as a pre-deposition surface preparation process, providing that a way to generate the plasma is available. In the case of metals containing carbon, this cleaning process is especially efficacious for substrates containing at least about 1 wt. % carbon, such as cast iron.

Figure 3B:
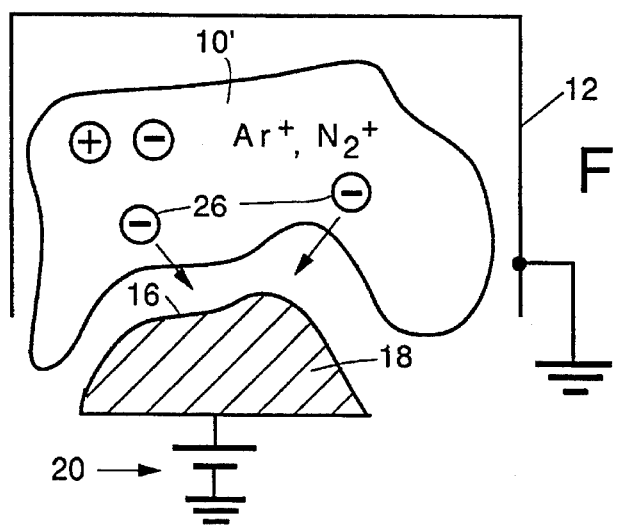

Heating of the substrate can be accomplished simultaneously with the cleaning process by using hydrogen ion bombardment at 100 to 200V. Alternatively, following the cleaning process, electron bombardment may be used to heat the sample. The electrons can either be attracted from hydrogen plasma 22 or the plasma 22 can be turned OFF, and an argon-ion plasma 10' may be created that surrounds the substrate 18, as shown in FIG. 3B. The substrate 18 is biased positive with respect to the plasma 10' to bombard the substrate surface 16 with electrons 26 which heat the substrate surface to a desired temperature.

The voltage employed depends on the shape of the sample 18. Sharp corners get overheated under high voltage, and accordingly, some experimentation must be done to optimize the voltage to be applied to a particular shaped substrate 18. The voltage and current ranges to provide sufficient power flux at the surface of the order of 0.5 to 3 $W/cm^2$ are 20 to 100V, and 5 to 60A, respectively. These values will vary, depending on the substrate surface area.

Any inert gas may be used as a supply of electrons; examples include argon, nitrogen, neon, etc. Argon is preferred, as it is relatively inexpensive and easy to use.

The substrate is heated to a temperature in the range of about 300° to 600° C. Low substrate temperature is desired for minimizing thermal distortions, softening of the substrate, and reducing stress generated by thermal expansion mis-match. Further, there are the considerations of energy consumption and time to heat to a given temperature that tend to dictate the chosen temperature.

If the temperature of the substrate 18 is less than about 300° C. then the subsequently-deposited TiN film is not hard enough to provide the desired wear characteristics. If the temperature of the substrate is greater than about 600° C., then undesirable stress cracking of the subsequently-deposited TiN film may occur during cooling of the substrate, accompanied by substrate softening and distortion. For the cast iron samples treated in accordance with the invention, a temperature of about 400° C. has been found to be adequate.

The substrate 18 is bombarded with low energy electrons only for a time sufficient to reach the desired temperature. For example, it takes about 10 to 30 minutes to heat the cast iron sample to 400° C.

Figure 3C:
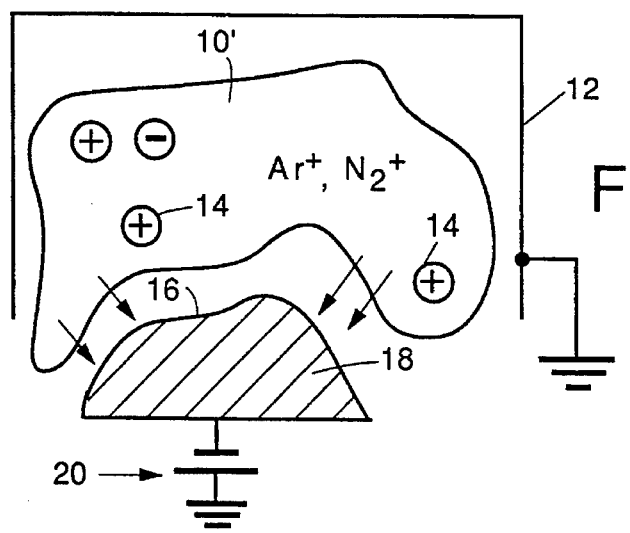

Once the substrate 18 has reached the selected temperature, it is then biased negative with respect to the plasma 10' to bombard the surface with ions 14 during the deposition of titanium nitride, as shown in FIG. 3C. The ions may be generated from any inert gas source, such as argon, xenon, neon, etc. Again, for the reasons given with respect to its use in the substrate heating portion of the process, argon is preferred.

The voltage range employed is about 60 to 150 volts. A voltage less than about 60 volts results in a soft TiN film. At a voltage greater than about 150 volts, argon tends to get trapped in the TiN film, making grain boundaries brittle and again resulting in a soft TiN film. Operating within the above voltage range results in a dense TiN, a smooth surface (less than 50 Å roughness), and a grain size of about 100 Å, which is considered optimum for wear resistance.

The Ar-ion bombardment is used to maintain the substrate temperature at a value selected for deposition, and to aid in influencing the titanium nitride structure for wear resistance. The temperature range is that given above for heating the substrate 18; once the substrate is heated to the chosen temperature, it is maintained at that temperature during TiN deposition.

The TiN deposition is done by conventional sputtering of a titanium target by a nitrogen-containing plasma. Under the foregoing conditions, TiN deposits at a rate of about 5 µm/hr. For TiN films used in wear-resistant applications, a deposition time of about 0.5 to 5 hours is sufficient. For example, for cutting tools, a TiN thickness of about 3 µm is sufficient, while for foundry wear, the thickness of the TiN film should be at least about 10 µm.

FIG. 4 depicts a schematic diagram of the PMD apparatus 30 suitably employed in the practice of the invention. The apparatus 30 comprises a chamber 32 defined by walls 12, showing the plasma 10', 22 and metal source targets 34 for sputtering titanium. As described above, plasma 10' comprises a mixture of argon and nitrogen ions, while plasma 22 comprises hydrogen ions. During use of the latter plasma, the titanium source targets 34 would not be activated.

As shown in FIG. 4, use is made of multiple planar magnetron sputter target sources 34 to produce energetic (several eV) titanium atoms. For depositing on smaller substrates 18, one target 34 may be used; however, preferably, at least two such targets are employed where deposition is done on larger substrates. Use is also made of a plasma 10', rather than an ion-beam source, to allow larges-cale, conformal treatment of three-dimensional irregularly shaped objects 18.

The following description is presented in terms of depositing thin films of titanium nitride onto surfaces 16 of substrates 18. The sputter targets 34 are energized by bias means 36, which are controlled by means (not shown). Also, the sputter targets 34 are movable, by means (not shown), in order to permit orientation of the targets with respect to the substrate 18.

The substrate 18 is supported on a substrate support 38, which is isolated from the walls 12 by insulating feedthrough 40, which provides electrical insulation of the substrate from the walls. The substrate 18 can be biased by bias means 20 to any polarity and to any voltage, independent of these three processes. Biasing of the substrate 18 can be accomplished using either DC, for continuous and uniform film deposition, or using pulses for tailored thin film deposition.

The plasma-enhanced magnetron-sputtered deposition apparatus 30 of the invention is a closed system, comprising the chamber 32 defined by walls 12 which surround the plasma 10', 22, the sputter targets 34, and the substrate Inlet means 42 are provided for introducing an inert gas, which forms a component of the plasma 10'. Inlet means 44 are also provided for introducing a gas, e.g., hydrogen, that is used in the cleaning of the production of the substrate 18 by the plasma 22 and for introducing nitrogen, which forms another component of the plasma 10', used in the deposition of titanium nitride. Outlet means 46 are used to evacuate the chamber 32.

The inert gas employed in the plasma 10' may comprise any of the inert gases, such as argon, neon, and xenon. Preferably, argon is employed in the practice of the invention.

The pressure of the inert gas, e.g., argon, ranges from about $5 \times 10^{-4}$ to $5 \times 10^{-3}$ Torr, and typically is about $2 \times 10^{-3}$ Torr. The vapor pressure of nitrogen, ranges from about $2 \times 10^{-4}$ to $2 \times 10^{-3}$ Torr, and typically is about $83 \times 10^{-4}$ Torr.

Magnets 48 are accordingly placed around the perimeter of the walls 12 of the vacuum chamber 14 to aid in confining the plasma 10', 22 and in improving the efficiency of operation of the plasma at low pressure.

A filament 50 provides electrons for creating the plasma 10', 22. A discharge power supply 52 is used to create the plasma. The plasma 10', 22 can be created either by a filament 50 inside the deposition chamber 32, or it can be created by operating a remote plasma source, or sources. The use of remote plasma sources is described in patent applications Ser. No. 07/758,405, filed Aug. 30, 1992, and Ser. No. 07/749,013, filed Aug. 23, 1992, and assigned to the same assignee as the present application.

The substrate 18, titanium sputter targets 34, and plasma 10', 22 are all electrically decoupled from each other and from the walls 12 of the deposition chamber, so as to provide independent electrical control of each component. The substrate 18 is isolated from the plasma 10', 22 and from the chamber walls 12 by using an insulated feedthrough 40 for supporting the substrate. The plasma 10', 22 is isolated from the vacuum chamber wall 12 by using an anode liner 54 as shown in FIG. 4. This allows the plasma 10', 22 as a whole to be biased positive or negative with respect to the other elements of the system.

The preferred titanium nitride deposition process of the invention may be summarized as a novel process consisting of a hydrogen-ion cleaning and graphite removal, used for high (>1 wt. % carbon) carbonaceous-containing substrates. Substrate heating can be achieved using the hydrogen-ion bombardment or using electron bombardment of the substrate. An Ar-ion bombardment process is then used to maintain the substrate temperature during the titanium nitride deposition, and to control the titanium nitride microstructure for the formation of hard coatings.

The process of the invention is distinct and different from the conventional prior art process in that the new process includes the additional novel step of cleaning the substrate and simultaneously removing surface graphite using a hydrogen plasma. This aids in improving the adhesion of titanium nitride deposited in the manner described herein, or using any conventional, generic, deposition process for titanium nitride involving the use of argon-ion bombardment from a plasma for substrate heating during deposition and for microstructure control. Additionally, electrons can be used for initial substrate heating.

Figure 5A:
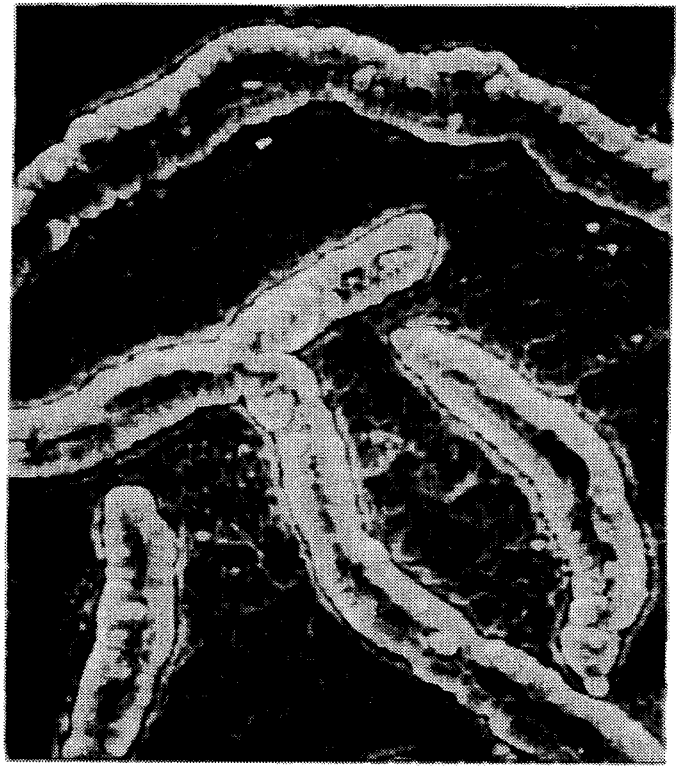
FIGS. 5A and 5B are scanning electron microscope photographs comparing the surface features of cast iron samples coated with titanium nitride by the process of the invention, but using Ar$^+$ bombardment with no hydrogen plasma treatment (FIG. 5A, 1000X), and by the process of the invention (FIG. 5B, 1200X)
Figure 5B:

FIGS. 5A and 5B show scanning electron microscope (SEM) photographs comparing the surface features of two cast iron samples coated with titanium nitride. The sample shown in FIG. 5B has been coated with titanium nitride using the surface preparation and deposition treatment described in accordance with the invention, while the sample shown in FIG. 5A has been coated with titanium nitride by the same deposition process, but without the surface preparation.

FIG. 5A clearly shows the presence of lameliar, graphite flakes. FIG. 5B is devoid of graphite flakes.

EXAMPLES

EXAMPLE 1

The process of the invention was successful in reducing the wear of untreated cast iron blocks subjected to sand-abrasion wear in the manufacturing environment of a foundry plant. A total of five cast iron blocks were treated with various processes for comparison with five untreated blocks. One of the blocks was treated in accordance with the process of the invention and used in comparison with four untreated blocks. In the treatment in accordance with the invention, the following steps were done:

(a) the surface of the cast iron substrate was cleaned with hydrogen ions in a hydrogen plasma at a density of $10^{10}$ hydrogen ions/cm$^3$ for 1 hour; the energy of the hydrogen ions was 100 volts;

(b) the substrate was then heated to a temperature of about 400° C. with electrons generated from an argon-ion plasma by biasing the substrate positive with respect to the plasma; the energy of the argon ions was 40 volts; and (c) a titanium nitride film was deposited in the presence of an argon plasma over the course of 1 hour; the energy of the argon ions was 100 volts.

To conduct the sand-abrasion wear experiment, the blocks were mounted onto a crankshaft pattern. A similar crankshaft pattern was used to mount four untreated cast iron blocks for wear comparison.

A total of 4,000 cycles was accumulated by the foundry plant to provide a preliminary evaluation of the wear resistance of the titanium nitride-treated cast iron blocks. At the completion of the 4,000 cycles, the amount of wear of each block (treated and untreated) was determined on the basis of dimensional measurements at various locations of the surface of each block. The coordinate measuring machine (CMM) used to measure the amount of wear at each point had an accuracy of ±1 mil (±0.0025 cm). Therefore, wear measurements of each block could only be made if more than 1 mil of wear was experienced.

Figure 6:
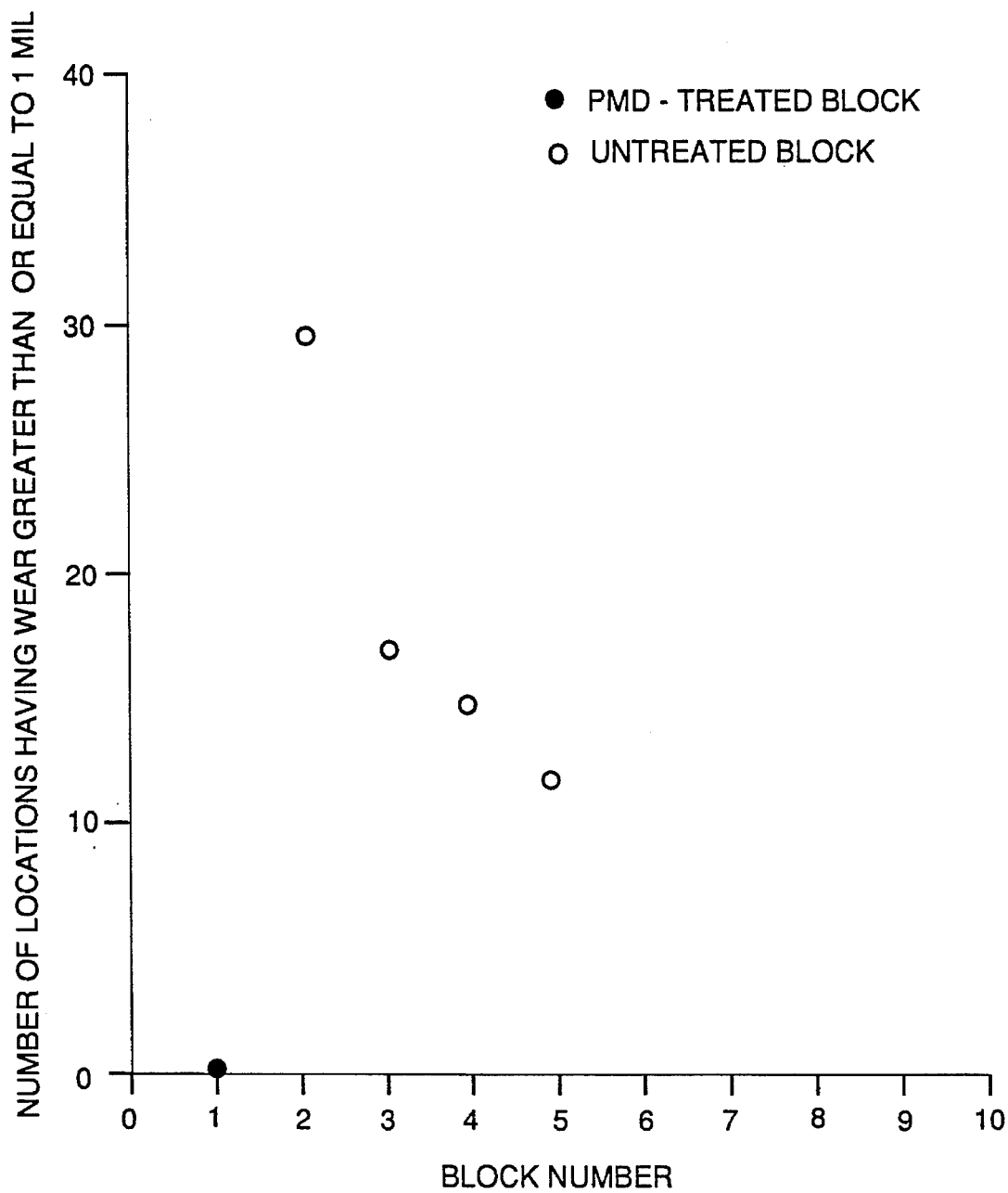
FIG. 6 is a comparative plot of the total number of locations having measurable wear of greater than or equal to 1 mil (0.0025 cm) for cast iron samples provided with a titanium nitride coating using the surface treatment process of the invention (removal of graphite) and for cast iron samples devoid of such coating and process.

FIG. 6 compares the total number of locations having measurable wear, that is, wear greater than or equal to 1 mil. For each untreated block, there were between 10 and 30 locations having this measurable wear. For the cast iron block treated in accordance with the invention, there was no measurable wear.

EXAMPLE 2

Comparison was next made between a cast iron block coated with titanium nitride in accordance with the invention and a cast iron block coated with titanium nitride coated by the process disclosed in U.S. Pat. No. 4,197,175, supra, also called the RE process. For the block coated by the RE process, measurable wear was recorded for 2 locations at the completion of the wear test. This is in contrast to the process of the invention, which resulted in no measurable wear for any location.

In addition to wear determined by dimensional change, color change is an additional indicator. When the gray-colored base metal shows through, this is an indication that the gold-colored titanium nitride coating has been worn through. This type of visual monitor of the wear process was verified during the wear test.

FIG. 7 shows a comparison of the wear of cast iron blocks treated in accordance with the invention (Curve 56) and the RE process (Curve 58), based on visual observation of the coating color during the wear test. The top of the graph represents a virgin coating, prior to beginning the wear test. The bottom of the graph represents total removal of the coating.

The data shown in FIG. 7 indicates that the block treated in accordance with the invention was about two times better in wear resistance than the RE process.

Thus, there has been disclosed a process for providing improved adhesion of titanium nitride onto the surface of carbon-containing materials, such as cast iron, comprising simultaneous cleaning of the surface and removal of graphite from the surface. Several changes and modifications of an obvious nature may be made, which will be readily apparent to those skilled in this art, and all such changes and modifications are considered to fall within the scope of the invention, as defined by the appended claims.

What is claimed is:

1. A process for depositing a coating of titanium nitride onto a modified surface of a metallic substrate containing greater than 1 wt. % carbon, said carbon comprising graphite, comprising the steps of:

(a) cleaning said surface to remove contaminates from said surface and modifying said surface by exhausting any said graphite from said surface by exposure thereof to a first plasma comprised of ions;

(b) heating said surface with first ions or first electrons from said first plasma to a chosen temperature within the range of about 300° to 600° C.; and (c) depositing said coating of said titanium nitride onto said modified surface of said substrate in a second plasma which provides second ions while maintaining the temperature of said substrate at said chosen temperature.

2. The process of claim 1 wherein said first plasma comprises first ions selected from the group consisting of hydrogen, fluorine, and chlorine.

3. The process of claim 2 wherein said ions from said first plasma are provided from a source gas selected from the group consisting of hydrogen, carbon tetrafluoride, and carbon tetrachloride.

4. The process of claim 2 wherein said substrate is biased negative with respect to said first plasma.

5. The process of claim 4 wherein said substrate is biased negative with a voltage ranging from about 50 to 200 volts.

6. The process of claim 4 wherein said first plasma has a density of about $10^{10}$ to $10^{12}$ ions/cm$^3$.

7. The process of claim 1 wherein said substrate is heated with first ions by surrounding said substrate with said first plasma and biasing said substrate negative with respect to said first plasma.

8. The process of claim 7 wherein said first plasma is generated from hydrogen gas, said first plasma providing a power flux at said surface ranging from about 0.5 to 3 W/cm$^2$ in order to heat said substrate to said chosen temperature.

9. The process of claim 1 wherein said substrate is heated with first electrons by surrounding said substrate with said first plasma and biasing said substrate positive with respect to said first plasma.

10. The process of claim 9 wherein said second plasma is generated from a source selected from the group consisting of argon, hydrogen, nitrogen, and neon, said second plasma providing a power flux at said surface ranging from about 0.5 to 3 W/cm$^2$ in order to heat said substrate to said chosen temperature.

11. The process of claim 1 wherein said substrate is biased negative with respect to said second plasma.

12. The process of claim 11 wherein said substrate is biased negatively with a voltage ranging from about 60 to 150 volts.

13. A process for depositing a coating of titanium nitride onto a modified surface of a cast iron substrate containing graphite particles comprising the steps of:

(a) cleaning said surface to remove any contaminants therefrom and modifying said surface by exhausting any graphite from said surface by exposure of said substrate to a first plasma comprising hydrogen and biasing said substrate negative with respect to said first hydrogen plasma;

(b) heating said substrate employing a second plasma; and (c) sputter-depositing said coating of said titanium nitride onto said modified surface of said cast iron substrate in third plasma comprising argon, wherein said substrate is biased negative with respect to said third argon plasma.

14. The process of claim 13 wherein the voltage of said first hydrogen plasma ranges from about 50 to 200 volts.

15. The process of claim 13 wherein said heating of said substrate is carried out with electrons by surrounding said substrate with said second plasma, said second plasma comprising argon, and biasing said substrate positive with respect to said second argon plasma.

16. The process of claim 15 wherein said heating of said substrate is carried out in said second argon plasma at a power flux at said surface ranging from about 0.5 to 3 W/cm$^2$.

17. The process of claim 13 wherein said heating of said substrate is carried out simultaneously with said cleaning and graphite-removal in said first hydrogen plasma, using hydrogen ions.

18. The process of claim 13 wherein said heating of said substrate is carried out with electrons from said hydrogen first plasma by biasing said substrate positive with respect to said first hydrogen plasma.

19. The process of claim 13 wherein said deposition of said coating of titanium nitride is carried out in said third argon plasma using a bias voltage ranging from about 60 to 150 volts.

20. A process for removing graphite flakes from a surface of a cast iron substrate containing greater than 1 wt. % carbon comprising:

exposing said surface to a plasma comprised of ions selected from the group consisting of hydrogen, fluorine, and chlorine.

21. The process of claim 20 wherein said ions are provided from a source gas selected from the group consisting of hydrogen, carbon tetrafluoride, and carbon tetrachloride.

22. The process of claim 20 wherein said substrate is biased negative with respect to said plasma.

23. The process of claim 22 wherein said substrate is biased negatively with a voltage ranging from about 50 to 200 volts.

24. The process of claim 20 wherein said plasma has a density of about $10^{10}$ to $10^{12}$ ions/cm$^3$.

* * * * *